(12) United States Patent
Jin et al.

(10) Patent No.: US 10,274,654 B2
(45) Date of Patent: Apr. 30, 2019

(54) PIXEL ARRANGEMENT STRUCTURE, DISPLAY PANEL AND DISPLAY DEVICE

(71) Applicant: BOE TECHNOLOGY GROUP CO., LTD., Beijing (CN)

(72) Inventors: Xiaodan Jin, Beijing (CN); Lujiang Huangfu, Beijing (CN); Yinan Liang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 13 days.

(21) Appl. No.: 15/536,347

(22) PCT Filed: May 5, 2016

(86) PCT No.: PCT/CN2016/081097
§ 371 (c)(1),
(2) Date: Jun. 15, 2017

(87) PCT Pub. No.: WO2017/140038
PCT Pub. Date: Aug. 24, 2017

(65) Prior Publication Data
US 2018/0088260 A1 Mar. 29, 2018

(30) Foreign Application Priority Data
Feb. 18, 2016 (CN) .................... 2016 2 0127445 U

(51) Int. Cl.
*G09F 9/302* (2006.01)
*G02B 5/20* (2006.01)
(Continued)

(52) U.S. Cl.
CPC ............. *G02B 5/201* (2013.01); *G02F 1/136* (2013.01); *G02F 1/1362* (2013.01); *G09F 9/302* (2013.01);
(Continued)

(58) Field of Classification Search
CPC .............. G02B 5/201; H01L 27/14601; H01L 27/14621; H01L 27/3218; G02F 1/136;
(Continued)

(56) References Cited

U.S. PATENT DOCUMENTS

| 4,652,912 A | 3/1987 | Masubuchi |
| 8,754,913 B2 | 6/2014 | Hwang et al. |

(Continued)

FOREIGN PATENT DOCUMENTS

| CN | 104037202 A | 9/2014 |
| CN | 104597655 A | 5/2015 |
| CN | 104795431 A | 7/2015 |

OTHER PUBLICATIONS

International Search Report of PCT/CN2016/081097 in Chinese, dated Nov. 16, 2016 with English translation.
(Continued)

*Primary Examiner* — William R Alexander
(74) *Attorney, Agent, or Firm* — Collard & Roe, P.C.

(57) ABSTRACT

A pixel arrangement structure, a display panel and a display device are provided. The pixel arrangement structure includes a plurality of repeating units, each repeating unit includes one first sub-pixel, one second sub pixel and two third sub-pixels; the four sub-pixels of each repeating unit constitute two pixels, with the first sub-pixel and the second sub-pixel being shared by the two pixels; in a first direction of the pixel array, the sub-pixel density is equal to 1.5 times of the pixel density, in a second direction of the pixel array, the sub-pixel density is equal to 1.5 times of the pixel density; wherein, the first direction and the second direction are different directions.

20 Claims, 5 Drawing Sheets

(51) Int. Cl.
*G02F 1/136* (2006.01)
*G02F 1/1362* (2006.01)
*G09F 9/33* (2006.01)
*H01L 27/32* (2006.01)

(52) U.S. Cl.
CPC .............. *G09F 9/3023* (2013.01); *G09F 9/33* (2013.01); *H01L 27/3218* (2013.01)

(58) Field of Classification Search
CPC ...... G02F 1/1362; G09F 9/302; G09F 9/3023; G09F 9/33
USPC .......................................................... 359/891
See application file for complete search history.

(56) References Cited

U.S. PATENT DOCUMENTS

| 9,472,600 | B2 | 10/2016 | Lin et al. |
| 9,905,604 | B2* | 2/2018 | Murata ............. H01L 27/14645 |
| 2013/0234917 | A1 | 9/2013 | Lee |
| 2015/0270317 | A1 | 9/2015 | Lee et al. |
| 2016/0049438 | A1* | 2/2016 | Murata ............. H01L 27/14603 257/229 |
| 2016/0155781 | A1* | 6/2016 | Chaji .................. H01L 27/3218 257/89 |
| 2016/0240593 | A1* | 8/2016 | Gu ........................ G09G 3/3225 |
| 2016/0329385 | A1* | 11/2016 | Qiu ..................... H01L 27/3218 |
| 2016/0357076 | A1 | 12/2016 | Huangfu et al. |
| 2016/0358985 | A1* | 12/2016 | Bai ..................... H01L 27/3218 |

OTHER PUBLICATIONS

Notice of Transmittal of the International Search Report of PCT/CN2016/081097 in Chinese, dated Nov. 16, 2016.

Written Opinion of the International Searching Authority of PCT/CN2016/081097 in Chinese, dated Nov. 16, 2016 with English translation.

* cited by examiner

US 10,274,654 B2

PIXEL ARRANGEMENT STRUCTURE, DISPLAY PANEL AND DISPLAY DEVICE

CROSS REFEREMCE TO RELATED APPLICATIONS

This application is the National Stage of PCT/CN2016/081097 filed on May 5, 2016, which claims priority under 35 U.S.C. § 119 of Chinese Application No. 201620127445.0 filed on Feb. 18, 2016, the disclosure of which is incorporated by reference.

TECHNICAL FIELD

The present disclosure relates to a pixel arrangement structure, display panel and display device.

BACKGROUND

Nowadays, the continuous developments of the display technique has led to higher requirements to the display resolution and the higher display resolution in turn would increase the techniques complexity and cost for preparing and making displays. When the display resolution is at a similar level of the naked-eye resolution, the conventional mode of using three sub-pixels namely red (R), green (G) and blue (B) for defining one pixel briefly may be changed, based on the differences of naked eyes in distinguishing different colored pixels. That is, by sharing some sub-pixels which color have less sensitive resolutions at certain location in different pixels, and using relatively less sub-pixels to simulate the same pixel resolution performance, complexity and cost of the Fine Metal Mask (FMM) techniques is reduced.

With the emerging of iphone's retina concept and the improvements of other high-definition display technologies, the display resolution of relevant displays are progressively approaching, reaching and even exceeding the naked-eye resolution's limit. According to the physiological structure of human eyes, this so-called limit has been determined by the density of rod cells sensitive to the light inside the retina of human eyes, while the density of various cone cells of inside the retina of human eyes and which are sensitive to different colors is smaller than that of the rod cells, where the density of cone cells which are sensitive to short-wavelength blue color is the lowest, then that of cells sensitive to red color, and considering that the luminance effect of blue color and red color (the stimulation to the rod cells sensitive to light) is far less than green color, thus causing the location resolution of naked eyes to blue and red sub-pixels are remarkably lower than to the green sub-pixel location and to the pixel's luminance central location. Under certain pixel resolutions, naked eyes may distinguish the pixel's luminance central location and have normal perception about the color, but cannot distinguish the location or boundary of the blue and red sub-pixels in pixel scale, which provides the technical possibility for sharing adjacent blue and red sub-pixels at some extent between adjacent pixels.

SUMMARY

One embodiment of the disclosure provides a pixel arrangement structure, comprising a plurality of repeating units, wherein each repeating unit comprises one first sub-pixel, one second sub-pixel and two third sub-pixels; the four sub-pixels of each repeating unit constitute two pixels, the first sub-pixel and the second sub-pixel being shared by the two pixels; in a first direction of the pixel array, the sub-pixel density is equal to 1.5 times of the pixel density, in a second direction of the pixel array, the sub-pixel density is equal to 1.5 times of the pixel density; and the first direction and the second direction are different directions.

In some examples, the first direction and the second direction are two directions being perpendicular to each other in a same plane.

In some examples, the first direction is a horizontal direction and the second direction is a vertical direction.

In some examples, the first sub-pixel is red sub-pixel, the second sub-pixel is blue sub-pixel, and the third sub-pixel is green sub-pixel.

In some examples, in the first direction, the green sub-pixels are disposed in pairs in each of which two green sub-pixels are adjacently disposed so as to form a plurality of green sub-pixel pairs arranged along the first direction; one red sub-pixel and one blue sub-pixel are disposed between any two adjacent pairs of green sub-pixels.

In some examples, the two green sub-pixels in each pair of green sub-pixels are arranged along the first direction.

In some examples, both the red sub-pixel and the blue sub-pixel have a shape of trapezoid, a base of the red sub-pixel and a base of the blue sub-pixel are disposed to be opposed to each other; each green sub-pixel has a shape of pentagon, the pentagon comprises a pair of parallel opposite sides and a perpendicular side, the perpendicular side being perpendicular to the pair of parallel opposite sides; wherein the perpendicular sides of each pair of the green sub-pixels are disposed adjacent to each other; the bases of the red sub-pixel and of the blue sub-pixel are parallel to the pair of parallel opposite sides of the green sub-pixels.

In some examples, a shorter base of the red sub-pixel and a shorter base of the blue sub-pixel are disposed to be adjacent to each other.

In some examples, in the second direction, the green sub-pixels are disposed in pairs in each of which two green sub-pixels are adjacently disposed so as to form a plurality of green sub-pixel pairs arranged along the second direction; one red sub-pixel and one blue sub-pixel are disposed between any two adjacent pairs of green sub-pixels.

In some examples, the two green sub-pixels in each pair of green sub-pixels are arranged along the second direction.

In some examples, both the red sub-pixel and the blue sub-pixel have a shape of hexagon, each of three pairs of opposite sides of the hexagon has two sides parallel to each other; each green sub-pixel has a shape of pentagon, the pentagon comprises a pair of parallel opposite sides and a perpendicular side, the perpendicular side being perpendicular to the pair of parallel opposite sides; wherein the perpendicular sides of each pair of green sub-pixels are disposed adjacent to each other; a pair of parallel opposite sides of the red sub-pixel with longer length and a pair of parallel opposite sides of the blue sub-pixel with longer length, are parallel to the pair of parallel opposite sides of the green sub-pixels.

Another embodiment of the disclosure provides a display panel, comprising the pixel arrangement structure as mentioned above.

Another embodiment of the disclosure provides a display device, comprising the display panel as mentioned above.

BRIEF DESCRIPTION OF THE DRAWINGS

In order to illustrate embodiments of the disclosure clearly, drawings required for a description of the embodiments will be described briefly. Apparently, the drawings in the following description are only some embodiments of the present disclosure, rather than limitations to the present disclosure.

Reference numbers: 10—pixel; 101—red sub-pixel; 102—blue sub-pixel; 103—green sub-pixel.

DETAILED DESCRIPTION

Solutions in the embodiments of the present disclosure will be described clearly and completely below in conjunction with the accompanying drawings of the embodiments of the present disclosure. It is obvious that the described embodiments are only part of the embodiments of the present disclosure, but not all the embodiments. Based on the embodiments of the present disclosure, other embodiments obtained by those ordinary skilled in the art without creative labors would belong to the protection scope of the present disclosure.

Figure 1:
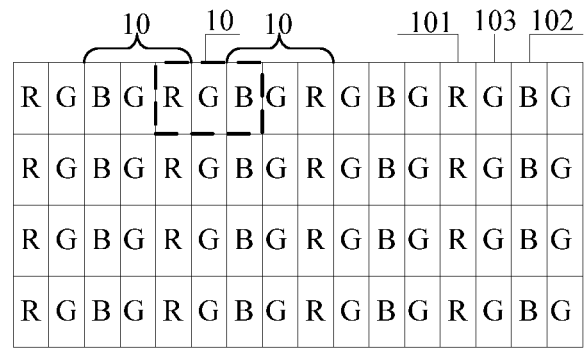
FIG. 1 is a diagram illustrating the arrangement of red, green and blue sub-pixels in the pixel arrangement structure according to some related arts.

With reference to FIG. 1, in some related arts, in the row direction, red, green, blue, and green sub-pixels are arranged in cycles, wherein in each pixel 10, there is an independent green sub-pixel 103, a red sub-pixel 101 and a blue sub-pixel 102 located on both sides and shared by the adjacent pixels 10, thus the sub-pixel density in the direction of rows is two times of the pixel density, and the sub-pixel density in the direction of columns is the same as the pixel density.

Accordingly, although the same resolution ratio may be achieved with a few sub-pixels, in the direction of rows the sub-pixel density is still equal two times of the pixel density, which results in high requirements to the FMM technique level.

An embodiment according to the present disclosure provides a pixel arrangement structure, comprising a plurality of repeating units, each repeating unit comprising one first sub-pixel, one second sub-pixel and two third sub-pixels.

The four sub-pixels of each repeating unit constitute two pixels, the first sub-pixel and the second sub-pixel being shared by the two pixels. In a first direction of the pixel array, the sub-pixel density is equal to 1.5 times of the pixel density, in a second direction of the pixel array, the sub-pixel density is equal to 1.5 times of the pixel density. The first direction and the second direction are different directions.

It is to be noted that, in the first aspect, the pixel arrangement structure according to the embodiments of the present disclosure can be applied to any display device composed of three sub-pixels such as red, green and blue sub-pixels. Examples of the display device may be Liquid Crystal Display (LCD) and Organic Light-Emitting Diode (OLED) etc.

In the second aspect, since the first sub-pixel and the second sub-pixel of each pixel are shared by two pixels, the pixels according to the embodiments of the present disclosure cannot be considered as real pixels in a strict definition, where a pixel is defined by a complete one first sub-pixel, one second sub-pixel and one third sub-pixel. Therefore, the pixels of the present disclosure may be called virtual pixels.

Since the first sub-pixel and the second sub-pixel are shared by two pixels, the boundary of each virtual pixel is blurry. Thus, the shape of each pixel is not defined by the embodiments of the present disclosure.

In the third aspect, it is known to a person skilled in the art that, based on the pixel arrangement structure, the pixels and the first sub-pixel, the second sub-pixel and the third sub-pixels in each pixel may be distributed evenly.

In the fourth aspect, the first and second directions as illustrated in the accompanying drawings are only illustrations in a general view, that is, in order to satisfy that sub-pixel density is 1.5 times of pixel density and pixels and each sub-pixel in pixels are evenly distributed in overall, the first direction in a closer view might not be a completely straight line but wavy lines, the same applies to the second direction.

Here, to facilitate the FMM design, for example, the first direction is horizontal direction and the second direction is vertical direction. However, embodiments according to the present disclosure are not limited to this example. The first direction and the second direction may be for example two directions being perpendicular to each other in the same plane, such as the plane where the pixels are arranged.

Embodiments of the present disclosure provide a pixel arrangement structure, since the four sub-pixels in each repeating unit may form two pixels, wherein the first sub-pixel and the second sub-pixel are shared by two pixels, in the first direction of the pixel array, the sub-pixel density is 1.5 times of the pixel density, in the second direction of the pixel array, the sub-pixel density is 1.5 times of the pixel density. Compared to the technologies in the art where in one direction, the sub-pixel density is two times of the pixel density and in another direction, the sub-pixel density is equal to the pixel density, the embodiments of the present disclosure reduces the sub-pixel density while balancing the quantity of the sub-pixels in two directions, thus may avoid having too many sub-pixels in one particular direction. Thus when the pixel arrangement structure is applied to a display panel, the FMM techniques complexity for making the pixels of the display panel may be reduced in overall.

In an example, the first sub-pixel is red sub-pixel, the second sub-pixel is blue sub-pixel, and the third sub-pixel is green sub-pixel.

In other words, the pixel arrangement structure comprises a plurality of repeating units, wherein each repeating unit comprises one first sub-pixel, one blue sub-pixel and two green sub-pixels; the four sub-pixels of each repeating unit constitute two pixels, the red sub-pixel and the blue sub-pixel being shared by the two pixels; in a first direction of the pixel array, the sub-pixel density is equal to 1.5 times of the pixel density, in a second direction of the pixel array, the sub-pixel density is equal to 1.5 times of the pixel density; wherein, the first direction and the second direction are different directions.

It is to be noted that, in the first aspect, since the red sub-pixel and the blue sub-pixel of each pixel are shared by two pixels, the pixels according to the embodiments of the present disclosure cannot be considered as real pixels in a strict definition, where a pixel is defined by a complete one red sub-pixel, one green sub-pixel and one blue sub-pixel. Therefore, the pixels of the present disclosure may be called virtual pixels.

Since the red sub-pixel and the blue sub-pixel are shared by two pixels, the boundary of each virtual pixel is blurry. Thus, the shape of each pixel is not defined by the embodiments of the present disclosure.

In the second aspect, it is known to a person skilled in the art that, in the case of high resolution, the green sub-pixels play a critical role in deciding the perceived luminance central position of each pixel. Thus, based on the embodiments of the present disclosure, the green sub-pixels in each pixel may be in overall distributed evenly.

Since the embodiments of the present disclosure requires that whether in the first direction or in the second direction, the sub-pixel density is 1.5 times of the pixel density, causing difficulties for the green sub-pixels to be distributed with equal space in all the locations. Accordingly, the embodiments of the present disclosure may achieve the even distribution of the green sub-pixels in overall in a range of more than three pixel-spaces by slightly adjusting the relative position of the green sub-pixels in different rows and columns.

Based on this, the red sub-pixels and the blue sub-pixels shared by two adjacent pixels may be evenly distributed as much as possible together with the green sub-pixels.

Figure 2A:
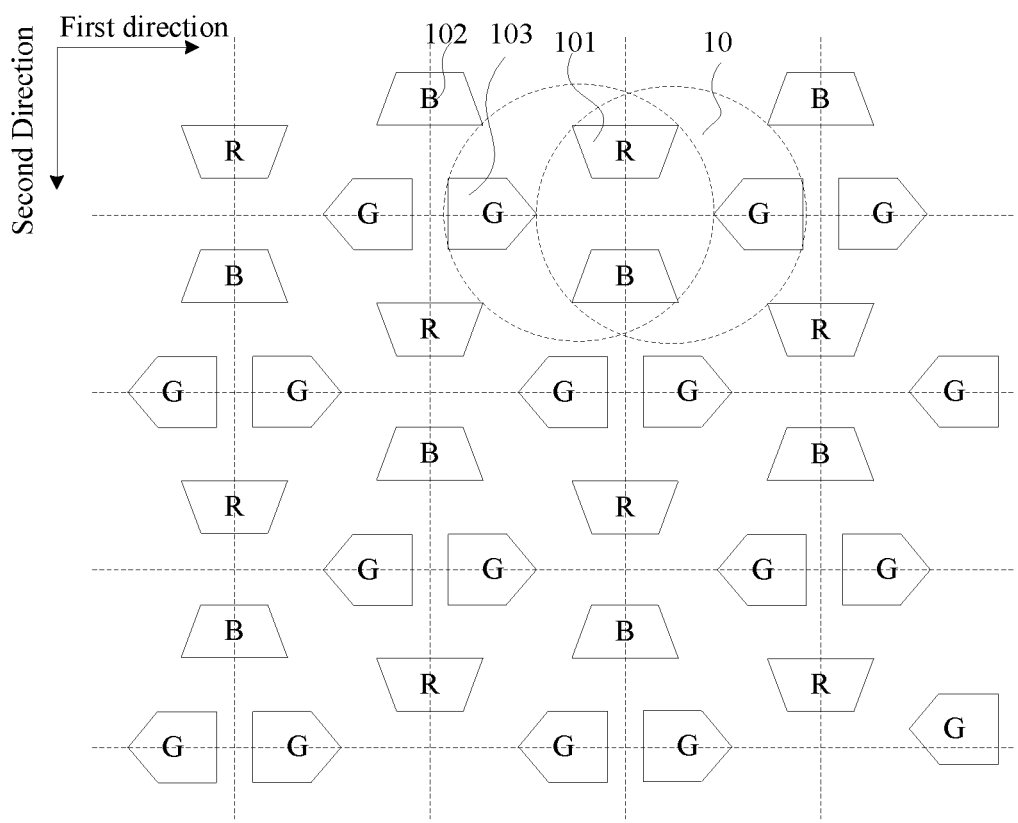
FIG. 2(a) is a first diagram illustrating the arrangement of red, green and blue sub-pixels in the pixel arrangement structure according to an embodiment of the present disclosure.
Figure 2B:
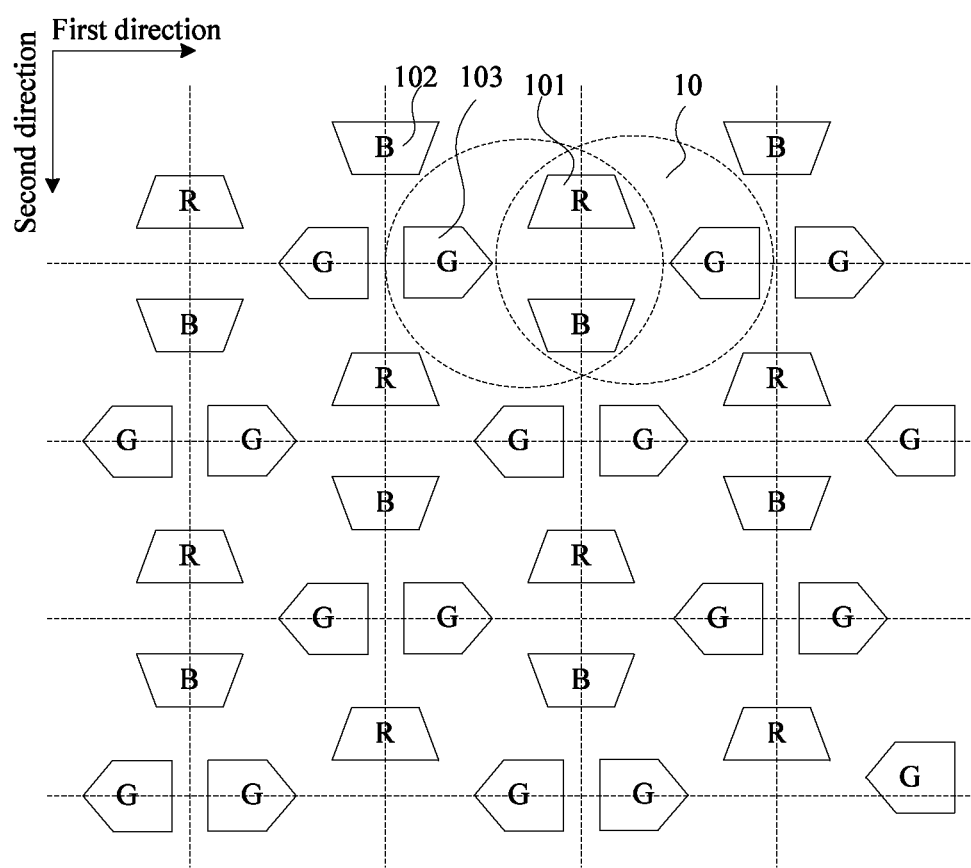
FIG. 2(b) is a second diagram illustrating the arrangement of red, green and blue sub-pixels in the pixel arrangement structure according to an embodiment of the present disclosure.

In an example illustrated in FIG. 2(a) and FIG. 2(b), in the first direction, the green sub-pixels 103 are disposed in pairs and within each pair, two green sub-pixels are adjacent to each other; a red sub-pixel 101 and a blue sub-pixel 102 is disposed between any two adjacent pairs of green sub-pixels 103. For example, the green sub-pixels disposed in pairs, in each of which two sub-pixels being adjacent to each other, forms a plurality of green sub-pixel pairs arranged in the first direction. For example, the two green sub-pixels of each green sub-pixel pair are arranged in the first direction.

In other words, all the green sub-pixels 103 in the first direction are in pairs, within each pair the green sub-pixels are disposed adjacent to each other.

Based on this, in a preferred embodiment, a red sub-pixel 101 and a blue sub-pixel 102 between any two adjacent pairs of green sub-pixels 103 are opposed to each other in the second direction.

Here, as in the first direction, the red sub-pixel 101 and the blue sub-pixel 102 are both disposed between two adjacent pairs of green sub-pixels 103, the requirement that the sub-pixel density is 1.5 times of the pixel density may thus be satisfied. The proportion of the numbers of the red sub-pixels 101, the green sub-pixels 103 and the blue sub-pixels 102 may be 1:2:1.

In some embodiments of the present disclosure, as in the first direction all the green sub-pixels 103 are disposed in pairs in each of which two green sub-pixels are adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus at some extent reducing the techniques complexity for preparing and making the color layer of the green sub-pixels 103.

Further, in the embodiments of the present disclosure, the adjacent green sub-pixels 103 may be disposed side by side along the first direction, and slight adjustments of the position of the green sub-pixels 103 may permit even distribution of the virtual pixel array. Also, by keeping certain distance between two most adjacent green sub-pixels, it may reduce the complexity of the techniques while guaranteeing the horizontal and vertical lines of the centers of the bright spots to be smooth and continuous (as illustrated in dash lines in FIG. 2(a) and FIG. 2(b)).

For example, as illustrated in FIG. 2(a) and FIG. 2(b), the shape of the red sub-pixels 101 and the blue sub-pixels 102 are both trapezoid, a base of the red sub-pixels 101 and a base of the blue sub-pixels 102 are disposed to be opposite to each other.

The shape of each green sub-pixel 103 is pentagon, the pentagon comprises a pair of parallel opposite sides and a perpendicular side, the perpendicular side being perpendicular to the pair of parallel opposite sides; wherein the perpendicular sides of each pair of the green sub-pixels 103 are disposed adjacent to each other; the bases of the red sub-pixels 101 and of the blue sub-pixels are parallel to the pair of parallel opposite sides of the green sub-pixel 103.

Figure 2C:
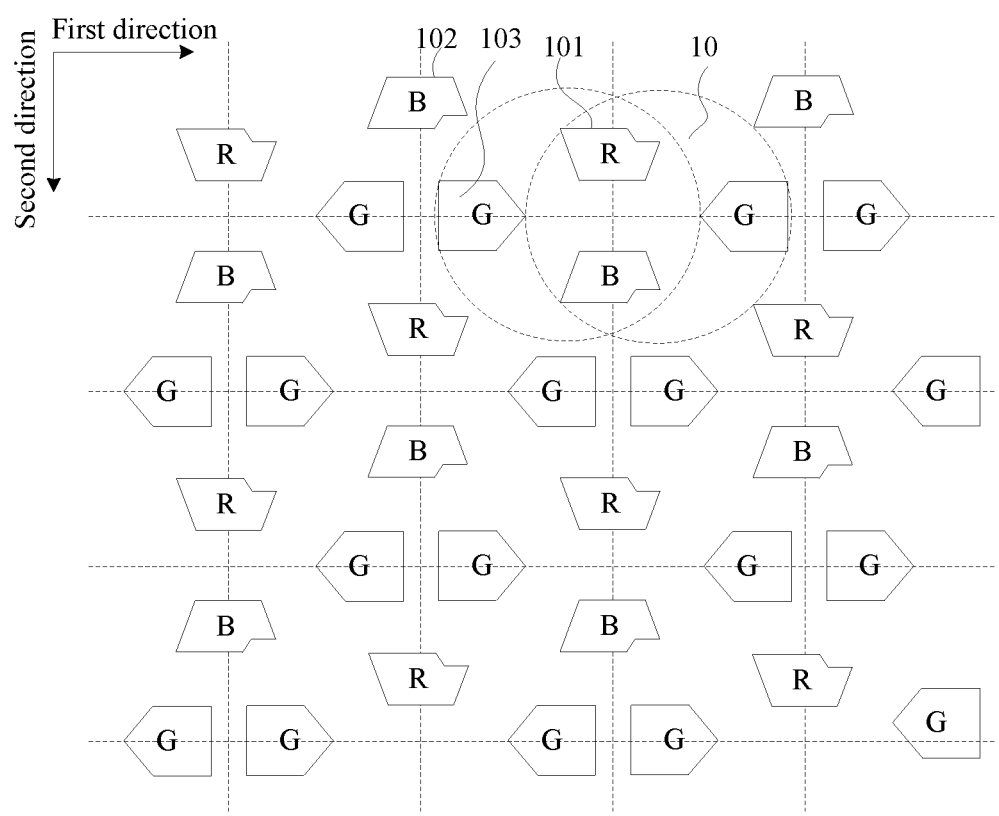
FIG. 2(c) is a diagram illustrating the actual arrangement of red, green and blue sub-pixels in the pixel arrangement structure according to an embodiment of the present disclosure.

It is to be noted that, the shape of the red sub-pixels 101 and the blue sub-pixels 102 ideally may be trapezoid, but in the actual FMM process, as the metallic etching may cause draft angles, so when using FMM vapor-deposit techniques for making read sub-pixels 101 and blue sub-pixels 102, the form of such formed red sub-pixels 101 and blue sub-pixels 102 may not be a standard trapezoid but in the shape as illustrated in FIG. 2(c). In an example illustrated in FIG. 2(c), the shape is a trapezoid with a corner being cut off.

In the embodiments of the present disclosure, as two green sub-pixels 103 are disposed adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus reducing the techniques complexity of the FMM techniques. As illustrated in FIG. 2(a) and FIG. 2(b), the green sub-pixels 103 as the luminance center of the virtual pixels, in the first direction, all of the green sub-pixels 103 are on the vertical dash lines, in the second direction, all of the green sub-pixels 103 are on either side of the vertical dash lines, and the green sub-pixels 103 are evenly distributed in the pixel array, thus guaranteeing that the horizontal and vertical lines of the center of the luminance to be smooth and continuous (as illustrated in dash lines in FIG. 2(a) and FIG. 2(b)).

Further, as illustrated in FIG. 2(a), the shorter base of the red sub-pixel 101 and the shorter base of the blue sub-pixel 102 are disposed to be adjacent to each other. In other words, the shorter base of the red sub-pixel 101 and the shorter base of the blue sub-pixel 102 are disposed to be opposed to each other.

In the embodiments of the present disclosure, a red sub-pixel 101 and a blue sub-pixel 102 are disposed between any two adjacent pairs of green sub-pixels 103, and since the shape of the red sub-pixel 101 and of the blue sub-pixel 102 is trapezoid, the shorter base of the red sub-pixel 101 and the shorter base of the blue sub-pixel 102 are disposed adjacent to each other, such that the distance between the green sub-pixels 103 and the red sub-pixels 101 as well as the blue sub-pixels 102 is relatively far, which is advantageous for the FMM design, and for reducing the FMM techniques complexity.

For example, in the second direction, the green sub-pixels 103 are disposed in pairs in each of which two sub-pixels are adjacently disposed, and one red sub-pixel 101 and one blue sub-pixel 102 are disposed between any two adjacent pairs of the green sub-pixels 103.

In other words, in the second direction all the green sub-pixels 103 are disposed in pairs, and in each pair two green sub-pixels 103 are disposed adjacent to each other.

Based on this, in an example, one red sub-pixel 101 and one blue sub-pixel 102 between any two adjacent pairs of green sub-pixels 103 are disposed to be opposed to each other in the first direction.

Here since in the second direction, the red sub-pixels 101 and the blue sub-pixels 102 are all disposed between two adjacent pairs of green sub-pixels 103, thus the requirement that the sub-pixel density is 1.5 times of the pixel density may be satisfied. The proportion of the numbers of the red sub-pixels 101, the green sub-pixels 103 and the blue sub-pixels 102 may be 1:2:1.

It is to be noted that in the second direction, the green sub-pixels 103 are disposed in pairs and within each pair two green sub-pixels 103 are disposed adjacent to each other; one red sub-pixel 101 and one blue sub-pixel may be disposed between any two adjacent pairs of green sub-pixels 103, which allows that in the first direction and in the second direction, the sub-pixel density is 1.5 times of pixel density and the virtual pixel array is evenly distributed. For example, the green sub-pixels which are in pairs and within each pair the two green sub-pixels being adjacent to each other forms a plurality of green sub-pixel pairs arranged in the second direction. For example, the two green sub-pixels in each green sub-pixel pair are arranged in the second direction.

In the embodiments of the present disclose, in the second direction all the green sub-pixels 103 are disposed in pairs and within each pair two green sub-pixels being adjacent to each other, during preparation of the OLED using the FMM vapor-deposit technique, it is possible to connect the color layer of the two green sub-pixels 103 of each pair, and to form a green luminescence layer of the two green sub-pixels 103 of each pair via one FMM vapor-deposit hole, thus at some extent reducing the techniques complexity for preparing and making the color layer of the green sub-pixels 103.

Further, in the embodiments of the present disclosure, the adjacent green sub-pixels 103 may be disposed side by side in the second direction, and slight adjustments of the position of the green sub-pixels 103 may permit even distribution of the virtual pixel array. Also, by keeping certain distance between two most adjacent green sub-pixels 103, it may reduce the complexity of the techniques while guaranteeing the horizontal and vertical lines of the centers of the bright spots to be smooth and continuous (as illustrated in dash lines in FIG. 3(a) and FIG. 3(b)).

Figure 3A:
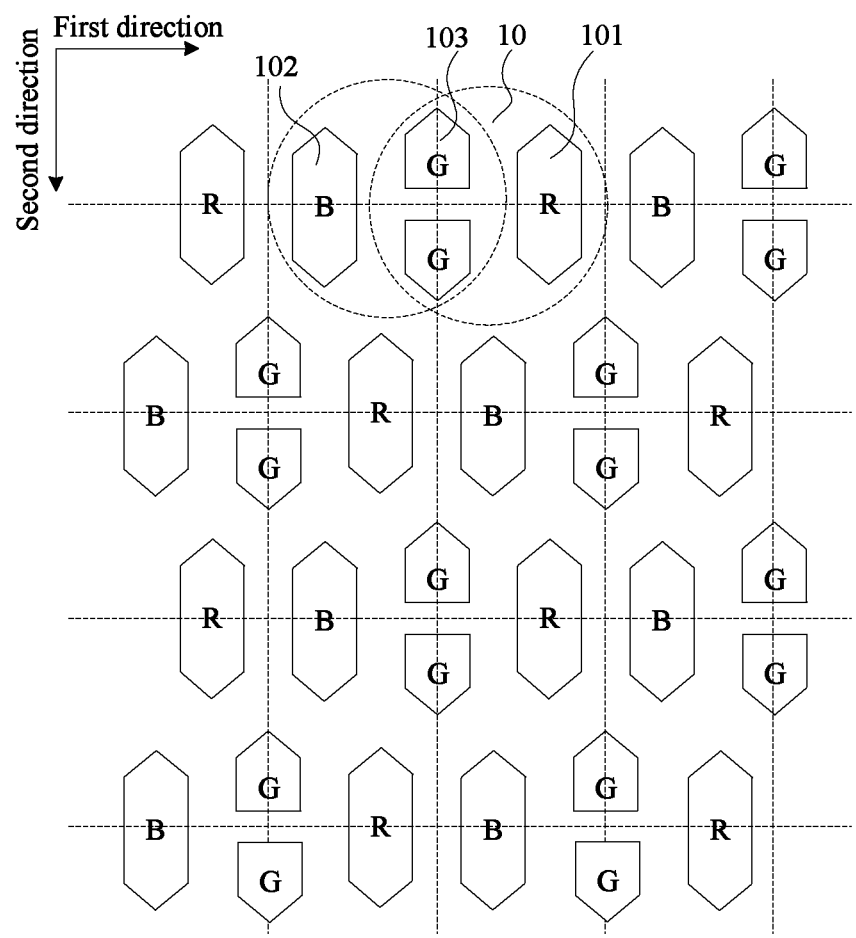
FIG. 3(a) is a third diagram illustrating the arrangement of red, green and blue sub-pixels in the pixel arrangement structure according to an embodiment of the present disclosure.
Figure 3B:
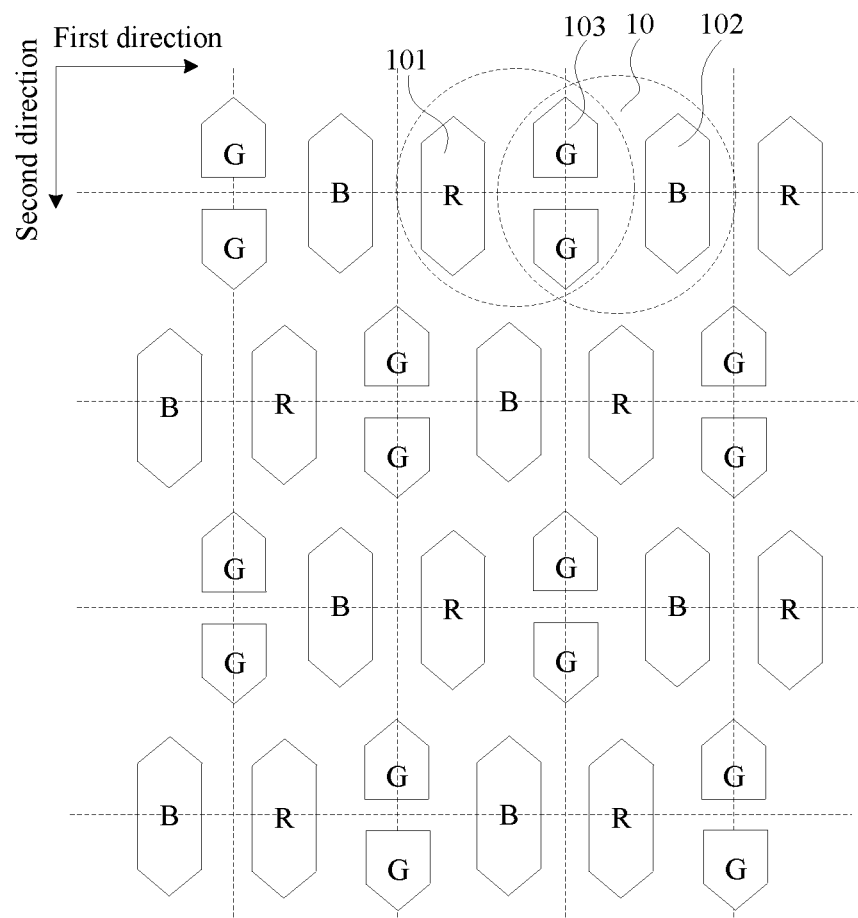
FIG. 3(b) is a fourth diagram illustrating the arrangement of red, green and blue sub-pixels in the pixel arrangement structure according to an embodiment of the present disclosure.

In some embodiments, as illustrated in FIG. 3(a) and FIG. 3(b), the shapes of the red sub-pixels 10 and the blue sub-pixels 102 are both hexagon, the three pairs of opposite sides of the hexagon having each pair of sides parallel to each other.

The shape of each green sub-pixel is pentagon, the pentagon comprises a pair of parallel opposite sides and a perpendicular side, the perpendicular side being perpendicular to the pair of parallel opposite sides; wherein the perpendicular sides of each pair of the green sub-pixels 103 are disposed adjacent to each other.

The pair of parallel opposite sides of the red sub-pixels 101 with longer length and the pair of parallel opposite sides of the blue sub-pixels 102 with longer length, are parallel to a pair of parallel opposite sides of the green sub-pixels 103.

Here it is to be noted that, positions of the red sub-pixels 101, the blue sub-pixels 102 and the green sub-pixels 103 in each repeating unit may be adjusted in an arbitrary manner as long as in the first direction and in the second direction of the pixel array, the sub-pixel density is 1.5 times of the pixel density, for example, as those illustrated in FIG. 3(a) or in FIG. 3(b).

It is noted that although some shapes of the sub-pixels in accordance with the embodiments of the present disclosure are described with reference to FIG. 2(a)-FIG. 3(b), the embodiments according to the present disclosure shall not be limited to those drawings and the sub-pixels according to the present disclosure may be in the any other shapes that may be suitable.

In the embodiments of the present disclosure, given that the pair of parallel opposite sides of the red sub-pixels 101 with longer length and the pair of parallel opposite sides of the blue sub-pixels 102 with longer length, are parallel to a pair of parallel opposite sides of the green sub-pixels 103, in one aspect, each FMM opening may be designed to be quasi-hexagon, thus favoring the FMM design; in another aspect, when FMM vapor-deposit techniques is adopted to vapor-deposit the sub-pixels, the net tensile force will be mainly applied on the longer side, thus avoiding damages to the FMM and favoring the success rate of net tension.

The embodiments of the present disclosure provides a display panel, pixels of the display panel are arranged according to the above-described pixel arrangement structure.

The embodiment of the present disclosure also provides a display device, which comprises the above-described display panel.

The display device in accordance with the embodiments of the present disclosure can be applied to any display device including three sub-pixels such as red, green and blue sub-pixels, for example, liquid crystal display (LCD) and organic light-emitting diode (OLED), etc.

What are described above is related to the illustrative embodiments of the disclosure only and not limitative to the scope of the disclosure; the scope of the disclosure are defined by the accompany drawings.

This application claims priority to the Chinese patent application No. 201620127445.0, filed Feb. 18, 2016, the entire disclosure of which is incorporated herein by reference as part of the present application.

What is claimed is:

1. A pixel arrangement structure, comprising a plurality of repeating units, wherein each repeating unit comprises one first sub-pixel, one second sub-pixel and two third sub-pixels;

the four sub-pixels of each repeating unit constitute two pixels, the first sub-pixel and the second sub-pixel being shared by the two pixels;

in a first direction of the pixel array, the sub-pixel density is equal to 1.5 times of the pixel density, in a second direction of the pixel array, the sub-pixel density is equal to 1.5 times of the pixel density; and the first direction and the second direction are different directions.

2. The pixel arrangement structure according to claim 1, wherein the first direction and the second direction are two directions being perpendicular to each other in a same plane.

3. The pixel arrangement structure according to claim 1, wherein the first direction is a horizontal direction and the second direction is a vertical direction.

4. The pixel arrangement structure according to claim 1, wherein the first sub-pixel is red sub-pixel, the second sub-pixel is blue sub-pixel, and the third sub-pixel is green sub-pixel.

5. The pixel arrangement structure according to claim 4, wherein, in the first direction, the green sub-pixels are disposed in pairs in each of which two green sub-pixels are adjacently disposed so as to form a plurality of green sub-pixel pairs arranged along the first direction;
one red sub-pixel and one blue sub-pixel are disposed between any two adjacent pairs of green sub-pixels.

6. The pixel arrangement structure according to claim 5, wherein the two green sub-pixels in each pair of green sub-pixels are arranged along the first direction.

7. The pixel arrangement structure according to claim 5, wherein both the red sub-pixel and the blue sub-pixel have a shape of trapezoid, a base of the red sub-pixel and a base of the blue sub-pixel are disposed to be opposed to each other;
each green sub-pixel has a shape of pentagon, the pentagon comprises a pair of parallel opposite sides and a perpendicular side, the perpendicular side being perpendicular to the pair of parallel opposite sides; wherein the perpendicular sides of each pair of the green sub-pixels are disposed adjacent to each other;
the bases of the red sub-pixel and of the blue sub-pixel are parallel to the pair of parallel opposite sides of the green sub-pixels.

8. The pixel arrangement structure according to claim 5, wherein a shorter base of the red sub-pixel and a shorter base of the blue sub-pixel are disposed to be adjacent to each other.

9. The pixel arrangement structure according to claim 1, wherein, in the second direction, the green sub-pixels are disposed in pairs in each of which two green sub-pixels are adjacently disposed so as to form a plurality of green sub-pixel pairs arranged along the second direction;
one red sub-pixel and one blue sub-pixel are disposed between any two adjacent pairs of green sub-pixels.

10. The pixel arrangement structure according to claim 9, wherein the two green sub-pixels in each pair of green sub-pixels are arranged along the second direction.

11. The pixel arrangement structure according to claim 9, wherein both the red sub-pixel and the blue sub-pixel have a shape of hexagon, each of three pairs of opposite sides of the hexagon has two sides parallel to each other;
each green sub-pixel has a shape of pentagon, the pentagon comprises a pair of parallel opposite sides and a perpendicular side, the perpendicular side being perpendicular to the pair of parallel opposite sides; wherein the perpendicular sides of each pair of green sub-pixels are disposed adjacent to each other;
a pair of parallel opposite sides of the red sub-pixel with longer length and a pair of parallel opposite sides of the blue sub-pixel with longer length, are parallel to the pair of parallel opposite sides of the green sub-pixels.

12. A display panel, comprising the pixel arrangement structure according to claim 1.

13. A display device, comprising the display panel according to claim 12.

14. The display panel according to claim 12, wherein the first direction and the second direction are two directions being perpendicular to each other in a same plane.

15. The display panel according to claim 12, wherein the first direction is a horizontal direction and the second direction is a vertical direction.

16. The display panel according to claim 12, wherein the first sub-pixel is red sub-pixel, the second sub-pixel is blue sub-pixel, and the third sub-pixel is green sub-pixel.

17. The display panel according to claim 16, wherein, in the first direction, the green sub-pixels are disposed in pairs in each of which two green sub-pixels are adjacently disposed so as to form a plurality of green sub-pixel pairs arranged along the first direction;
one red sub-pixel and one blue sub-pixel are disposed between any two adjacent pairs of green sub-pixels.

18. The display panel according to claim 17, wherein the two green sub-pixels in each pair of green sub-pixels are arranged along the first direction.

19. The display panel according to claim 17, wherein both the red sub-pixel and the blue sub-pixel have a shape of trapezoid, a base of the red sub-pixel and a base of the blue sub-pixel are disposed to be opposed to each other;
each green sub-pixel has a shape of pentagon, the pentagon comprises a pair of parallel opposite sides and a perpendicular side, the perpendicular side being perpendicular to the pair of parallel opposite sides; wherein the perpendicular sides of each pair of the green sub-pixels are disposed adjacent to each other;
the bases of the red sub-pixel and of the blue sub-pixel are parallel to the pair of parallel opposite sides of the green sub-pixels.

20. The display panel according to claim 17, wherein a shorter base of the red sub-pixel and a shorter base of the blue sub-pixel are disposed to be adjacent to each other.

* * * * *